United States Patent [19]

Squire

[11] Patent Number: 4,982,056

[45] Date of Patent: Jan. 1, 1991

[54] AMORPHOUS COPOLYMERS OF PERFLUORO-2,2-DIMETHYL-1,3-DIOXIDE

[75] Inventor: Edward N. Squire, Glen Mills, Pa.

[73] Assignee: E. I. Du Pont de Nemours and Company, Wilmington, Del.

[21] Appl. No.: 501,113

[22] Filed: Mar. 29, 1990

Related U.S. Application Data

[60] Division of Ser. No. 361,412, Jun. 5, 1989, Pat. No. 4,935,477, which is a continuation-in-part of Ser. No. 148,579, Jan. 26, 1988, abandoned, which is a division of Ser. No. 904,095, Sep. 4, 1986, Pat. No. 4,754,009, which is a continuation-in-part of Ser. No. 723,649, Apr. 16, 1985, abandoned, which is a division of Ser. No. 591,486, Mar. 20, 1984, Pat. No. 4,530,569, which is a continuation-in-part of Ser. No. 294,789, Aug. 21, 1981, abandoned.

[51] Int. Cl.$^5$ .............................................. H05K 1/00
[52] U.S. Cl. ..................... 174/258; 428/901
[58] Field of Search .................. 174/258; 428/901

[56] References Cited

U.S. PATENT DOCUMENTS

| | | | |
|---|---|---|---|
| 2,468,664 | 4/1949 | Hanford et al. | 526/228 |
| 3,969,285 | 7/1976 | Gret | 260/2.2 R |
| 3,978,030 | 8/1976 | Resnick | 526/247 |
| 4,059,469 | 11/1977 | Mattimoe et al. | 156/108 |
| 4,173,033 | 10/1979 | Sako et al. | 361/323 |
| 4,362,785 | 12/1982 | Schultz et al. | 428/480 |
| 4,420,225 | 12/1983 | Bäver et al. | 350/409 |
| 4,530,569 | 7/1985 | Squire | 350/96.34 |
| 4,543,294 | 9/1985 | Sakagawi et al. | 428/422 |
| 4,617,350 | 10/1986 | Maeda et al. | 525/153 |
| 4,620,262 | 10/1986 | Olsen | 361/323 |
| 4,640,866 | 2/1987 | Suzuki | 428/422 |
| 4,680,220 | 7/1987 | Johnson | 428/241 |
| 4,720,428 | 1/1988 | Ohmori et al. | 428/373 |
| 4,743,480 | 5/1988 | Campbell et al. | 428/36 |
| 4,747,662 | 5/1988 | Fitz | 350/96.32 |
| 4,756,599 | 7/1988 | Maeda et al. | 350/96.29 |
| 4,758,067 | 7/1988 | Tatsukami et al. | 350/96.34 |

FOREIGN PATENT DOCUMENTS

| | | | |
|---|---|---|---|
| 835589 | 2/1970 | Canada | 356/103 |
| 0128517 | 12/1984 | European Pat. Off. | |
| 233443 | 2/1986 | European Pat. Off. | |
| 2654986 | 6/1977 | Fed. Rep. of Germany | |
| 2813622 | 10/1979 | Fed. Rep. of Germany | |
| 46-37972 | 11/1971 | Japan | |
| 50-2256 | 1/1975 | Japan | |
| 52-10554 | 1/1977 | Japan | |
| 54-100477 | 8/1979 | Japan | |
| 54-135400 | 10/1979 | Japan | |
| 55-72025 | 5/1980 | Japan | 361/323 |
| 55-159975 | 12/1980 | Japan | |
| 56-8321 | 2/1981 | Japan | |
| 57-84403 | 5/1982 | Japan | |
| 59-116701 | 7/1984 | Japan | |
| 59-155435 | 9/1984 | Japan | |
| 59-195203 | 11/1984 | Japan | |
| 59-200201 | 11/1984 | Japan | |
| 60-19106 | 1/1985 | Japan | |
| 60-147703 | 8/1985 | Japan | |
| 60-205403 | 10/1985 | Japan | |
| 60-260905 | 12/1985 | Japan | |
| 61-20909 | 1/1986 | Japan | |
| 61-63802 | 4/1986 | Japan | |
| 61-103107 | 5/1986 | Japan | |
| 61-114208 | 5/1986 | Japan | |
| 61-179735 | 8/1986 | Japan | |
| 61-223806 | 10/1986 | Japan | |
| 61-252507 | 11/1986 | Japan | |
| 61-258813 | 11/1986 | Japan | |
| 62-47605 | 3/1987 | Japan | |
| 819218 | 5/1981 | U.S.S.R. | |

*Primary Examiner*—Joseph L. Schofer
*Assistant Examiner*—N. Sarofim
*Attorney, Agent, or Firm*—Paul R. Steyermark

[57] ABSTRACT

Amorphous copolymers of perfluoro-2,2-dimethyl-1,3-dioxole with at least one fluoro comonomer selected from one or more of ten defined classes having a recited minimum mole proportion of perfluoro-2,2-dimethyl-1,3-dioxole, in no event less than 65%, have high glass transition temperatures of 140° C. or higher, low indices of refraction, and good physical properties, and low dielectric constants, which make them suitable for cladding optical fibers as well as for many electronics applications, including the manufacture of substrates for circuit boards. They all are soluble at room temperature in perfluoro(2-butyltetrahydrofuran), which makes it practical to apply them as coatings from solution.

6 Claims, No Drawings

AMORPHOUS COPOLYMERS OF PERFLUORO-2,2-DIMETHYL-1,3-DIOXIDE

This is a division of my copending application Ser. No. 07/361,412, filed June 5, 1989, now U.S. Pat. No. 4,935,477, which was a continuation-in-part of application Ser. No. 07/148,579 filed Jan. 26, 1988, and now abandoned, which was a division of application Ser. No. 06/904,095 filed Sept. 4, 1986, now U.S. Pat. No. 4,754,009, which was a continuation-in-part of application Ser. No. 06/723,649 filed Apr. 16, 1985 and now abandoned, which was a division of application Ser. No. 06/591,486 filed Mar. 20, 1984, now U.S. Pat. No. 4,530,569, which was a continuation-in-part of application Ser. No. 06/294,789 filed Aug. 21, 1981 and now abandoned.

BACKGROUND OF THE INVENTION

This invention relates to certain amorphous fluoropolymers which are particularly suitable as cladding materials in optical fiber constructions as well as in certain electronics applications, molded articles, and films.

While tetrafluoroethylene homopolymers and copolymers have many excellent properties, they usually suffer from low modulus, especially at elevated temperature; poor creep resistance; insolubility; and in some cases intractability. Various fluoropolymers have been proposed from time to time for cladding optical fibers, mainly because of their low refractive indices. A good polymeric cladding material for optical fibers should be completely amorphous because crystallites present in polymers would cause light scattering. Further, it should have a high glass transition temperature, Tg, especially if intended for use at high temperatures because above its Tg it would lose some of its desirable physical properties and in particular it would be unable to maintain good bonding to the fiber core. A desirable Tg would be above 140° C., preferably above 180° C., especially above 220° C. Suitable, entirely amorphous fluoropolymers having significantly high Tg's have not been heretofore reported.

U.S. Pat. No. 3,978,030 to Resnick describes certain polymers of perfluoro-2,2-dimethyl-1,3-dioxole (PDD), which has the following formula:

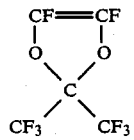

The above patent describes both homopolymers of PDD, which are not further characterized, and a crystalline copolymer with tetrafluoroethylene (TFE), which has a melting point of about 265° C.

Since Resnick's discovery of PDD homopolymer, it has been established that the material is amorphous and has a very high Tg of about 330° C. The homopolymer, however, is not readily melt-processible because of poor flow and some degradation.

Crystalline copolymers of PDD with TFE cannot be used in many applications, where, for example, optical clarity, dimensional stability, solubility, or high $T_g$ is required.

The polymers of U.S. Pat. No. 3,978,030 have thus not been produced commercially, in spite of the fact that perfluoro polymers having desirable properties would have many possible uses in various high technology applications.

It has now been found that the dioxole PDD forms amorphous copolymers that have unique properties that make them particularly suitable for a number of special applications requiring high performance.

SUMMARY OF THE INVENTION

According to this invention, there are now provided amorphous copolymers of 58–99 mole % of perfluoro-2,2-dimethyl-1,3-dioxole with complementary amounts of more than one comonomer selected from the class consisting of the following compounds:

(a) tetrafluoroethylene,
(b) chlorotrifluoroethylene,
(c) vinylidene fluoride,
(d) hexafluoropropylene,
(e) trifluoroethylene,
(f) perfluoro(alkyl vinyl ethers) of the formula $CF_2=CFOR_F$, where $R_F$ is a normal perfluoroalkyl radical having 1–3 carbon atoms,
(g) fluorovinyl ethers of the formula $CF_2=CFOQZ$, where Q is a perfluorinated alkylene radical containing 0–4 ether oxygen atoms, wherein the sum of the C and O atoms in Q is 2 to 10; and Z is a group selected from the class consisting of $-COOR$, $-SO_2F$, $-CN$, $-COF$, and $-OCH_3$, where R is a $C_1-C_4$ alkyl,
(h) vinyl fluoride, and
(i) (perfluoroalkyl)ethylene, $R_fCH=CH_2$, where $R_f$ is a $C_1-C_8$ normal perfluoroalkyl radical;

the glass transition temperature of the copolymers being at least 140° C.;

the maximum mole percentage, $M_a \ldots M_i$, of each comonomer in the copolymers being as follows:

(a) for tetrafluoroethylene, $M_a=35$,
(b) for chlorotrifluoroethylene, $M_b=42$,
(c) for vinylidene fluoride, $M_c=20$,
(d) for hexafluoropropylene, $M_d=15$,
(e) for trifluoroethylene, $M_e=30$,
(f) for $CF_2=CFOR_F$, $M_f=30$,
(g) for $CF_2=CFOQZ$, $M_g=20$,
(h) for vinyl fluoride, $M_h=25$, and
(i) for $R_fCH=CH_2$, $M_i=10$;

and the amount of each comonomer other than PDD being such that the sum, S, of the ratios of their mole percentages, $m_a \ldots m_i$, to the maximum percentage of all such comonomers, 42 mole %, is no larger than 1, as shown below:

$$S = m_a/42 + m_b/42 + \ldots m_i/42 \leq 1.$$

There also are provided dipolymers of 58–99 mole % of perfluoro-2,2-dimethyl-1,3-dioxole with a complementary amount of any one of the above comonomers other than tetrafluoroethylene, the maximum mole percentage, $M_b \ldots M_i$, of each comonomer being as shown above, and the glass transition temperature of those dipolymers being at least 140° C.

As used herein, the term "complementary" means that the mole percentage of perfluoro-2,2-dimethyl-1,3-dioxole plus the mole percentages of all the above comonomers (a) through (i), present in the copolymer add together to 100%.

DETAILED DESCRIPTION OF THE INVENTION

The copolymers of the present invention preferably have a $T_g$ of at least 180° C. When such copolymers contain more than one comonomer copolymerized with PDD, the value of S is less than 1. The especially preferred copolymers of the present invention have a $T_g$ of at least 220° C. When those copolymers contain more than one comonomer copolymerized with PDD, the value of S is significantly less than 1, for example, 0.8 or less.

All the principal monomers used in this invention are known to the art. The perfluoro (alkyl vinyl ethers) (f) include perfluoro(methyl vinyl ether), perfluoro(ethyl vinyl ether), and perfluoro(n-propyl vinyl ether). The ethers (g) include, i.a., methyl perfluoro(3,6-dioxa-4-methyl-8-nonenoate) (further referred to as EVE) represented by the following formula

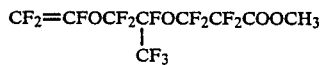

and perfluoro(4-methyl-3,6.-dioxa-7-octenyl) sulfonyl fluoride (further referred to as PSEPVE) represented by the following formula

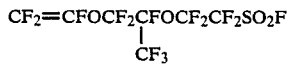

TFE is made in large quantities by E. I. du Pont de Nemours and Company; other suitable representative monomers are available from the following sources: $VF_2$, chlorotrifluoroethylene (CTFE), hexafluoropropylene (HFP), vinyl fluoride, and trifluoroethylene from SCM Specialty Chemicals, Gainesville, FL; perfluoro(methyl vinyl ether) (PMVE), and perfluoro(propyl vinyl ether) (PPVE) are made as described in U.S. Pat. No. 3,180,895; (EVE) is made as described in U.S. Pat. No. 4,138,740; and PSEPVE is made as described in U.S. Pat. No. 3,282,875. PDD is described in the above-mentioned U.S. Patent No. 3,978,030.

It has now been discovered that PDD can be copolymerized with any one or more of the above-named monomers to amorphous copolymers.

The amorphous copolymers of the present invention, are soluble at room temperature in perfluoro(2-butyltetrahydrofuran), which is a commercial solvent available from 3M Company under the tradename FC-75. In addition, they have the following outstanding combination of properties:

1. high glass transition temperatures;
2. high moduli, especially at elevated temperatures;
3. high strengths, especially at elevated temperatures;
4. low creep under compressive load.
5. melt fabricability at moderate temperatures;
6. fabricability into films and coatings by solvent casting;
7. low temperature sprayability;
8. unusually low refractive indices;
9. excellent dielectric properties;
10. excellent chemical resistance.

The first four characteristic properties of the copolymers of the present invention are particularly advantageous in applications where the polymer must bear a load at an elevated temperature. Because of their chemical inertness and excellent dielectric properties, they also are suitable for a number of specialized electrical applications. Also, because of their chemical inertness, good optical properties, and good physical properties, they are suitable for the manufacture of optical lenses. The polymers of this invention can also be filled or reinforced with solid substances to make composite materials. The additives include, i.a., graphite, graphite fibers, aramid fibers, mica, wollastonite, glass fibers, etc. Fibrous material may be in the form of loose fibers, fabrics, or mats. Such composite materials show enhancement of desirable properties such as modulus, for example.

Films of the amorphous copolymers of this invention are useful when thermally laminated to other polymeric films or metal foils. A laminate of the amorphous copolymers of this invention with copper foil is a superior substrate for flexible circuit production because the copolymer bonds directly with the copper without the necessity for an intervening adhesive. Conventional copper/adhesive/polyimide/ adhesive/copper structures for electronic circuit substrates have the deficiency of high dielectric constant material next to copper. This limits the ultimate speed of the electronic circuit. A laminate of copper/amorphous copolymer/copper permits very high circuit speeds because the amorphous copolymer film has a low dielectric constant (2.1) and can be thermally bonded directly to circuit copper.

A thermal laminate of amorphous copolymer/polyimide/amorphous copolymer is useful as an electronic circuit substrate. Compared to polyimide film itself, this laminate is a superior circuit substrate because (a) it may be thermally bonded to copper foil without adhesive; (b) the low water absorption of the amorphous copolymer gives the substrate greater dimensional stability in humid environments; and (c) the low dielectric constant of the amorphous copolymer allows the fabrication of a high speed circuit.

A thermal laminate of amorphous copolymer/polyimide is useful as a vacuum bag for the curing of parts such as helicopter blades made from carbon fiber reinforced thermoset. The high glass transition temperature, thermal stability and low surface energy of the amorphous copolymer give the laminate excellent release properties when this side is placed against the thermoset part to be cured. The polyimide layer of the laminate provides strength to prevent pinholing when the bag enclosing the thermoset part is evacuated and raised to curing temperature. After curing and cooling the laminate is easily separated from the part.

A thermal laminate containing film of amorphous copolymer as its outer faces and a film of oriented polypropylene as the core is useful as a low-cost film structure with outstanding chemical resistance and stain resistance combined with excellent mechanical properties. Such laminates can be used to protect sensitive instruments from environmental damage.

Pipe, tubing and fittings which are made from or lined with the amorphous copolymer of this invention prevent the contamination of the process liquid with metal ions, plasticizer, or degradation products from the fluid handling system. Such fluid handling components are of very high purity, are inert to most common chemicals, and are easily fabricated by injection molding, extrusion, machining from stock. Alternatively, fluid handling system components may be fabricated from metal, glass, or other plastic and subsequently lined with amorphous copolymer of this invention by solution coating, dispersion coating, or electrostatic powder coating. In addition to pipe, tubing and fittings, other useful fluid handling articles made from the amorphous copolymers of this invention are pump housings, pump impellers, valve bodies, valve stems, valve seals, diaphragms, tanks, trays, pipettes, laboratory vessels. Such articles are especially useful in semiconductor processing fluid handling systems where parts-per-billion purity is required in process water and chemicals. Also, in molecular biology research laboratories where extreme purity is required, and microgram quantities must be completely released from the vessels in which they are handled, the fluid handling articles made from the amorphous copolymer of this invention are particularly useful.

The amorphous copolymers of this invention are particularly useful when fabricated into articles to transport materials and components through chemical treatment processes. For example in the manufacturing process for semiconductor chips the silicon wafers must be transported through a series of chemical treatment steps; the containers in which the silicon wafers are carried must be chemically inert to prevent contamination of the chips, and they must be rigid and dimensionally stable to permit precise automatic positioning at each stage of the process. Compared to the conventional fluoroplastics used for such wafer carriers, e.g., the copolymer of tetrafluoroethylene and perfluoro(propyl vinyl ether), the amorphous copolymers of the present invention have greater rigidity and greater dimensional stability. This advantage makes possible the fabrication of larger wafer carriers, e.g, baskets to hold silicon wafers of 30 cm in diameter; wafer carriers made from conventional fluoroplastics are too low in flexural modulus to be useful for wafers larger than about 15 cm in diameter.

Other conveying system components for which articles made from the amorphous copolymers of the present invention are especially well suited are guide rails, conveyor belt links, bearings and rollers, clamps, racks, hooks, positioning pins, robot arm jaws and fingers, gears, cams and similar mechanical parts which must be precisely engineered, have good high temperature mechanical properties, retain dimensions, be chemically pure and chemically inert. Conveying system components made from the amorphous copolymers of this invention exposed to corrosive chemicals or ultrapure water are superior to all conventional fluoroplastics because of the superior high temperature mechanical properties and dimensional stability of the polymers of this invention.

The low dielectric constant (2.1) and low coefficient of thermal expansion of the amorphous copolymers of this invention make them especially useful as dielectrics in electrical and electronic applications. For example, the dielectric used between the separate circuit layers in high speed digital multi-layer circuit boards must be very low in dielectric constant and be very dimensionally stable from $-20°$ C. up to soldering temperature of approximately $225°$ C.. Polyimide is dimensionally stable but has a high dielectric constant ($>3$); in addition it is susceptible to atmospheric moisture; the amorphous copolymers of this invention do not have these deficiencies, and multi-layered circuits which have this polymer as a dielectric between circuit layers are capable of greater speed and greater circuit density.

The low moisture absorption, outstanding chemical resistance, purity, thermal stability, and dimensional stability of the amorphous copolymers of this invention make them especially suited for the protection of sensitive electronic circuits and components. Unlike conventional fluoroplastics the polymers of the present invention can be dissolved to form coating and encapsulating solutions. For example, a so-called "smart connector" may be encapsulated by dipping it, pins up, in a solution of the amorphous copolymer of Example 1 and evaporating the FC-75 solvent to leave a protective film of polymer to exclude environmental water and corrosive chemicals. In another embodiment the polymers of this invention may be used instead of a thin layer of gold, so-called "gold flash", to protect electronic connectors from corrosion from atmospheric chemicals. Whole electronic or electro-optic circuits may be encapsulated by the amorphous copolymers of this invention by a solution coating process, which is not possible with conventional fluoropolymers because of their insolubility in practical solvents. It is well known that aqueous dispersions of conventional fluoropolymers may be used to impregnate and encapsulate articles such as glass fabric and metal parts; however, the application of such dispersions is limited to substrates which can tolerate the high baking temperatures ($>200°$ C.) required to fuse the fluoroplastic into a pinhole-free coating. In contrast to aqueous dispersions of conventional fluoroplastics, solutions of the amorphous copolymers of the present invention may be applied to temperature sensitive substrates such as electronic circuits or electronic components made from thermoplastics, and the solvent evaporated at moderate temperature ($100°$ C. or less) to leave a protective polymer film without the necessity of high temperature baking to fuse the polymer.

As the amount of PDD in the copolymers of the present invention increases, the Tg also increases, although not necessarily in a linear fashion.

Tg is determined by differential scanning calorimetry (DSC) according to ASTM method D-3418. Examination of the DSC curve shows only a second order transition and no first order transition, indicating the absence of crystallinity. The relative proportions of the comonomers in the copolymer can be determined by fluorine-19 nuclear magnetic resonance spectroscopy ($^{19}$F NMR). The proportion of hydrogen-containing monomers can be determined by proton NMR together with $^{19}$F NMR.

The proportions of comonomers in some copolymers also can be determined by x-ray fluorescence (XRF), e.g., using a Philips Electronic Instruments 1404 XRF spectrometer. Calibration of x-ray fluoroescence intensity as a function of weight % oxygen and fluorine can be accomplished using three polymer samples of known composition which bracket the anticipated fluorine and oxygen content of the unknown PDD copolymers.

The copolymers of PDD with the fluoromonomers of this invention are readily meltprocessible, so that they can be fabricated into articles by such techniques as, e.g., injection molding and extrusion Furthermore, they have low refractive indices, which is a particularly desirable feature for optical fiber cladding. Since they are soluble in FC-75, they can be conveniently applied to substrates, such as optical fibers or flexible or rigid circuit boards, from solution to give thin polymer layers. Furthermore, films of these copolymers are clear and transparent, compared with hazy or translucent films of crystalline polymers. For this reason, the amorphous copolymers of the present invention are suitable for such applications as, for example, windows for chemical reactors, especially for processes using or manufacturing hydrogen fluoride.

It is to be noted that, while PDD homopolymers also are amorphous and have good chemical properties, they are not readily melt-fabricable because of some degradation occurring at the high processing temperatures required.

Copolymerization is carried out in the presence of a free radical generator at a temperature suitable for the initiator chosen. Well agitated pressure equipment and a nontelogenic solvent or diluent should be used, preferably one that has sufficient volatility to permit easy removal from the polymer.

This invention is now illustrated by the following examples of certain preferred embodiments thereof, where all parts, proportions, and percentages are by weight, unless otherwise indicated. Most Tg's were determined using Du Pont Differential Thermal Analyzer Model 1090 with 910 or 912 DSC modules. All units have been converted to SI units.

COMPARATIVE EXAMPLE A

A mixture of 5.0 g of PDD, 0.100 g of 4,4,-bis(t-butylcyclohexyl)peroxydicarbonate, and 40.0 g of 1,1,2-trichloro-1,2,2-trifluoroethane was placed in a pressure tube. The mixture was thoroughly degassed, sealed, and placed in a constant temperature bath at 30° C. for 20 hours. The polymerization mixture appeared as a thick, translucent slurry of polymer particles dispersed in 1,1,2-trichloro-1,2,2-trifluoroethane. The volatile material was removed by distillation, and the polymer residue was dried at 150° C. for 20 hours to give 4.7 g of PDD homopolymer. The products of four identical runs were combined. The polymer had two glass transition temperatures, at 333° and 350° C. The PDD homopolymer could not be melt-fabricated by compression molding without some degradation (evidenced by gas evolution). Moldings could be obtained within the temperature range 355°–370° C. Above 370° C., the degradation was quite noticeable; below 350° C., the polymer flow was insufficient for producing moldings, and coalescense to a homogeneous test slab was not achieved.

PDD homopolymer could be cast from perfluoro(2-butyltetrahydrofuran) solution. That material had good physical properties (e.g., high modulus) but this technique is impractical for thick parts.

EXAMPLE 1

A 2-liter vertical reactor equipped with a four-bladed impeller type agitator was charged with 1500 ml of deoxygenated, deionized water, 3.75 g of ammonium perfluorononanoate surfactant, and 4.70 g of ammonium sulfite. The reactor was pressurized with chlorotrifluoroethylene (CTFE), then vented.

With the agitator running at 600 rpm, 25 ml of a 7% ammonium persulfate (APS) solution in water was introduced into the reactor heated to 60° C.; next, an initial charge of 2.63 g of CTFE and 16 g of PDD was added. After the mixture had been stirred for 30 minutes, continuous feed of 5.25 g/hr of CTFE, 32 g/hr of PDD (CTFE/PDD mole ratio of 0.344) and 10 ml/hr of APS solution was begun and continued for 4.5 hours. The reactor was cooled to 30° C., and a dispersion containing 9.4% of solids was recovered.

Concentrated nitric acid (15 ml) was added to the dispersion in a blender and agitated. The dispersion separated into a water phase and a copolymer phase. The copolymer was filtered off, dried in an oven at 110° C. for 24 hours, and further dried in a vacuum oven at 100° C. to remove any traces of water. The copolymer was next fluorinated for 6 hours at 100° C. with a 25:75 fluorine/nitrogen mixture in a reactor which had been evacuated and purged with nitrogen. The total gas flow amounted to 0.132 part of fluorine per part of copolymer. The reactor was then purged with nitrogen and cooled. The granulated amorphous copolymer, which was recovered, had a single glass transition temperature of 174° C. Its composition was 19.7 mole % CTFE and 80.3 mole % PDD.

EXAMPLE 2

A copolymer of PDD and CTFE was prepared in the same manner as described in Example 1, except that the initial charge consisted of 2.66 g of CTFE and 16 g of PDD (CTFE/PDD mole ratio of 0.348). The dispersion recovered from the polymerization reactor contained 9.03% solids. The resulting copolymer was fluorinated as described in Example 1. It was amorphous, with a single Tg of 184 C and had a monomer composition of CTFE/PDD of 23:77 mole %.

EXAMPLE 3

A cold 200 ml Hastelloy (TM) C shaker tube was charged with 30 g of 1,1,2-trichloro-1,2,2-trifluoroethane, 6 g (0.0246 mole) of PDD, 0.02 g of 4,4,-bis(t-butylcyclohexyl)peroxydicarbonate, and 1 g (0.00237 mole) of EVE. The tube was evacuated while cold and flushed several times with nitrogen, then agitated 12 hours at 40° C. The resulting dipolymer was collected and dried 24 hours at 100° C. in a vacuum oven at 20.3 kPa pressure. The yield of dipolymer was 4.5 g (64% conversion). The dipolymer was amorphous, had a Tg of 186.7° C., and contained 90.8 mole% of PDD, as determined by $^{19}F$ NMR spectroscopy. Its inherent viscosity was 0.0735 m$^3$/kg, as measured at 27° C. in a 3.33 kg/m$^3$ solution in FC-75 ®.

EXAMPLE 4

A cold 240 ml Hasteloy (TM) C shaker tube was charged with 50 g of 1,1,2-trichloro-1,2,2-trifluoroethane and 10 g (0.041 mole) of PDD, 0.1 g of 4,4,-bis(t-butylcyclohexyl)peroxydicarbonate. The tube was evacuated cold and was charged with 2 g (0.0133 mole) of hexafluoropropene. The tube was agitated at 60° C. for 2 hours and at 70° C. for 2 hours. The resulting dipolymer was collected and dried at 130° C. in a vacuum oven for 10 hours. A white dipolymer powder, 7.4 g (62% conversion) was obtained. The dipolymer was amorphous, had a Tg of 265°–270° C., and contained 94.6 mole % PDD. The inherent viscosity of the dipolymer was 0.0293 m$^3$/kg, as measured at 23° C. in a 3.33 kg/m$^3$ solution in FC-75 ®.

EXAMPLE 5

A 500 ml creased, jacketed flask equipped with a mechanical stirrer, nitrogen sparger, and syringe inlet was charged with 200 ml of water and 1.02 g of ammonium perfluorononanoate. The flask was warmed up to dissolve ammonium perfluorononanoate and then cooled to room temperature. Concentrated ammonium hydroxide (3 ml), sodium sulfite (0.85 g, 0.0067 mole), PDD (25 g, 0.1025 mole), and perfluoro(n-propyl vinyl ether) (11.7 g, 0.044 mole) were charged into the flask in that order. The contents of the flask were stirred at 500 rpm. Potassium persulfate (0.90 g, 0.0033 mole) was injected into the flask. The reaction mixture was stirred overnight (total reaction time 21.5 hours). The resulting coagulum was filtered off, and the remaining latex was diluted with methanol, then coagulated with 20 g of magnesium sulfate in 100 ml of water. The resulting dipolymer was collected, washed three times with a methanol/water mixture, and dried overnight. The dry dipolymer weighed 12.6 g. The inherent viscosity of this amorphous copolymer was 0.0904 m$^3$/kg, as measured at 30° C. in a 3.33 kg/m$^3$ solution in FC-75 ®, and its Tg was 228° C. The approximate mole fraction of PDD in this dipolymer is 92%.

EXAMPLE 6

A cold 240 ml Hastelloy (TM) C shaker tube was charged with 80 g of 1,1,2-trichloro-1,2,2-trifluoroethane, 15 g (0.0615 mole) of PDD, 2 g (0.00474 mole) of EVE and 0.05g of 4,4,-bis(t-butylcyclohexyl) peroxydicarbonate. The tube was sealed, evacuated while cold, and was charged with 0.8 g (±0.2 g) (0.008 mole) of TFE. The tube was agitated at 40° C. for 12 hours. The resulting terpolymer was collected and dried 20 hours in a vacuum oven at 120° C. A white resin 10.5 g (59% conversion) was obtained. This terpolymer was amorphous and had a Tg of 162° C. The inherent viscosity of the terpolymer was 0.0734 m$^3$/kg, as measured at 25° C. in a 3.33 kg/m$^3$ solution in FC-75 ®. The terpolymer had a composition of PDD/TFE/EVE=79.5/16.5/4.0 (mole %) as determined by F-19 NMR spectroscopy.

EXAMPLE 7

A 2-liter horizontal reactor equipped with a paddle stirrer was charged with 1150 ml of deionized water, 4 g of ammonium perfluorononanoate, and 1.25 g of ammonium sulfite.

With the stirrer turning at 70 rpm, an initial charge of 14 g of perfluoro(methyl vinyl ether) (PMVE) and 32 g of PDD (PMVE/PDD mole ratio of 0.643) was introduced into the reactor heated to 65° C. Then, 30 ml of a 1% ammonium persulfate solution (APS) in water was added. The mixture was stirred at 65° C. for 10 minutes, after which a continuous feed of 20 g/hr of PMVE, 48 g/hr of PDD, and 30 ml of the APS solution was begun and continued for 6 hours. The reactor was cooled to 30° C. A dispersion containing 11.5% of solids was recovered.

The dispersion was coagulated by addition of 10 ml of concentrated nitric acid in a blender, separating into a water phase and a copolymer phase. The copolymer was dried 24 hours at 105° C. in an oven at normal pressure and then at 100° C. in a vacuum oven to remove any traces of water. The copolymer was then fluorinated at 100° C. for 6 hours in a previously evacuated and nitrogen-purged reactor with a 25:75 fluorine/nitrogen mixture, which was passed at the total rate of 0.085 part of fluorine per part of copolymer. The resulting amorphous copolymer had a single Tg of 173° C. and had a monomer composition of PMVE/PDD of 13:87 mole %.

EXAMPLE 8

A 2 liter horizontal polymerization kettle equipped with a paddle type agitator was charged with a solution of 1100 g of demineralized water containing 2.0 g of ammonium sulfite and heated to 60° C. The polymerization kettle was evacuated to 68 kPa. To the evacuated polymerization kettle were added 50 ml of 1,1,2-trichloro-1,2,2-trifluoroethane and 8.0 g of Asahi Glass "Surfion" S111S fluorosurfactant (which is essentially ammonium perfluorononanoate). With the agitator still off, 26.7 ml (42.7 g, 0.175 mole) of PDD was pressured into the polymerization kettle to give a pressure of 90 kPa. Then 13.5 g (0.116 mole) of CTFE was added, raising the pressure to 207 kPa. The mole fraction of CTFE in the monomer charge thus was 39.9%. After both monomers were added, agitation was begun at a rate of 200 rpm and a 1% aqueous solution of ammonium persulfate initiator was added at a rate of 150 ml/hr. After 36 minutes of feeding the initiator at this rate, reactor pressure had dropped to 179 kPa, indicating that polymerization had begun. At this point, ammonium persulfate addition was reduced to a feed rate of 60 ml/hr. PDD was now fed at a continuous rate of 51.7 ml/hr (82.7 g/hr, 0.34 mole/hr), and CTFE monomer was fed at a continuous rate of 26.7 g/hr (0.23 mole/hr) until a total of 155 ml (248 g, 1.02 mole) of PDD and 80.1 g (0.69 mole) of CTFE had been added after the initial pressure drop. The mole fraction of CTFE in the continuously fed monomer thus was 40.4%. Addition of both monomers and initiator was stopped at this time. After a further pressure drop to 158 kPa, the polymerization kettle was vented and the contents were recovered.

The resulting cooled latex weighed 1,732 g and had a solids content of 19.8%. An additional 554 ml of deionized water was added to dilute the latex to 15% solids. The diluted latex was transferred to a 5 L jacketed flask equipped with a mechanical paddle stirrer. The stirrer was turned at 350 rpm while 25 ml of concentrated (16 M) nitric acid was added rapidly. The dispersion gradually thickened to a gel. Stirring was stopped for 15 minutes. When stirring was resumed at 350 rpm, 86 ml of 1,1,2-trichloro1,2,2-trifluoroethane was poured into the flask at a rate of 300 ml/min. The gel immediately separated into copolymer and water phases. Stirring was continued for 15 minutes, after which the temperature was raised at a rate of 2.5° C./min to 45° C. by circulating hot water through the jacket of the flask. A nitrogen purge was begun in the flask to aid in solvent removal. Stirring at 45.C was continued for 1 hour to remove the bulk of the solvent, and then the temperature was raised to 75° C. at a rate of 2.5° C./minute. A dip tube with filter cloth at the bottom was placed into the flask, and water was pumped out of the flask with a peristaltic pump at the rate of 45 ml/minute. Fresh water was added to the flask at the same rate in order to keep the volume approximately constant. This washing was continued for about 2 hours, or until the pH of the effluent water was 7 as determined with an indicator paper. At this point, water addition was stopped and all but about 50 ml of water was removed from the flask.

Twenty-five ml of triethylamine was added to the flask, and the contents were allowed to stir at 77° C. under reflux for 12 hours. The solid copolymer was then recovered by vacuum filtration, washed twice with 100 ml aliquots of demineralized water, then dried in a vacuum oven for 12 hours at 100° C. The yield was 230 g of light brown polymer with a glass transition temperature of 149° C., corresponding to a CTFE content of 35 mole percent. The CTFE content was determined from a calibration curve of Tg vs. CTFE content, where CTFE content had been obtained by chlorine analysis.

I claim:

1. A composite substrate for the production of circuit boards manufactured from an amorphous copolymer of 58–99 mole % of perfluoro-2,2-dimethyl-1,3-dioxole with complementary amounts of more than one comonomer selected from the class consisting of the following compounds:
   (a) tetrafluoroethylene,
   (b) chlorotrifluoroethylene,
   (c) vinylidene fluoride,
   (d) hexafluoropropylene,
   (e) trifluoroethylene,
   (f) for $CF_2\!=\!CFORF$, $Mf=30$,
   (g) for $CF_2\!=\!CFOQZ$, $Mg=20$,
   (h) for vinyl fluoride, $Mh=25$, and
   (i) for $RfCH\!=\!CH_2$, $Mi=10$;
   and the amount of each comonomer other than perfluorodimethyl-1,3-dioxole being such that the sum, S, of the ratios of their mole percentages, ma . . . mi, to the maximum is no larger than 1, as shown below:

$$S = ma/42 + mb/42 + \ldots + mi/42 \leq 1.$$

2. An electric current carrying component or device being a circuit board or a component thereof comprising at least one electronic circuit element and containing at least one dielectric element, said dielectric element being made of an amorphous copolymer or 58–99 mole % of perfluoro-2,2-dimethyl-1,3-dioxole with complementary amounts of more than one comonomer selected from the class consisting of the following compounds:
   (a) tetrafluoroethylene,
   (b) chlorotrifluoroethylene,
   (c) vinylidene fluoride,
   (d) hexafluoropropylene,
   (e) trifluoroethylene,
   (f) perfluoro(alkyl vinyl ethers) of the formula $CF_2\!=\!CFORF$, where RF is a normal perfluoroalkyl radical having 1–3 carbon atoms,
   (g) fluorovinyl ethers of the formula $CF_2\!=\!CFOQZ$, where Q is a perfluorinated alkylene radical containing 0–4 ether oxygen atoms, wherein the sum of the C and O atoms in Q is 2 to 10; and Z is a group selected from the class consisting of —COOR, —SO2F, —CN, —COF, and —OCH3, where R is a C1–C4 alkyl,
   (h) vinyl fluoride, and
   (i) (perfluoroalkyl)ethylene, $RfCH\!=\!CH_2$, where Rf is a C1–C8 normal perfluoroalkyl radical;
   the glass transition temperature of the copolymer being at least 140° C.;
   the maximum mole percentage, Ma . . . Mi, of each comonomer in the copolymers being as follows:
   (a) for tetrafluoroethylene, $Ma=35$,
   (b) for chlorotrifluoroethylene, $Mb=42$,
   (c) for vinylidene fluoride, $Mc=20$,
   (d) for hexafluoropropylene, $Md=15$
   (e) for trifluoroethylene, $Me=30$
   (f) for $CF_2\!=\!CFORF$, $Mf=30$,
   (g) for $CF_2\!=\!CFOQZ$, $Mg=20$,
   (h) for vinyl fluoride, $Mh=25$, and
   (i) for $RfCH\!=\!CH_2$, $Mi=10$;
   and the amount of each comonomer other than perfluorodimethyl-1,3-dioxole being such that the sum, S, of the ratios of their mole percentages, ma . . . mi, to the maximum percentage of all such comonomers taken together, 42 mole %, is no longer than 1, as shown below:

$$S = ma/42 + mb/42 + \ldots + mi/42 \leq 1.$$

3. An article of electronic circuitry having on at least one of its exposed surfaces a protective coating of an amorphous copolymer of 58–99 mole % of perfluoro-2,2-dimethyl-1,3-dioxole with complementary amounts of more than one comonomer selected from the class consisting of the following compounds:
   (a) tetrafluoroethylene,
   (b) chlorotrifluoroethylene,
   (c) vinylidene fluoride,
   (d) hexafluoropropylene,
   (e) trifluoroethylene,
   (f) perfluoro(alkyl vinyl ethers) of the formula $CF_2\!=\!CFORF$, where RF is a normal perfluoroalkyl radical having 1–3 carbon atoms,
   (g) fluorovinyl ethers of the formula $CF_2\!=\!CFOQZ$, where Q is a perfluorinated alkylene radical containing 0–4 ether oxygen atoms, wherein the sum of the C and O atoms in Q is 2 to 10; and Z is a group selected from the class consisting of —COOR, —SO2F, —CN, —COF, and —OCH3, where R is a C1–C4 alkyl,
   (h) vinyl fluoride, and
   (i) (perfluoroalkyl)ethylene, $RfCH\!=\!CH_2$, where Rf is a C1–C8 normal perfluoroalkyl radical;
   the glass transition temperature of the copolymer being at least 140° C.;
   the maximum mole percentage, Ma . . . Mi, of each comonomer in the copolymers being as follows:
   (a) for tetrafluoroethylene, $Ma=35$,
   (b) for chlorotrifluoroethylene, $Mb=42$,
   (c) for vinylidene fluoride, $Mc=20$,
   (d) for hexafluoropropylene, $Md=15$
   (e) for trifluoroethylene, $Me=30$
   (f) for $CF_2\!=\!CFORF$, $Mf=30$,
   (g) for $CF_2\!=\!CFOQZ$, $Mg=20$,
   (h) for vinyl fluoride, $Mh=25$, and
   (i) for $RfCH\!=\!CH_2$, $Mi=10$;
   and the amount of each comonomer other than perfluorodimethyl-1,3-dioxole being such that the sum, S, of the ratios of their mole percentages, ma . . . mi, to the maximum percentages of all such comonomers taken together, 42 mole %, is no larger than 1, as shown below:

$$S = ma/42 + mb/42 + \ldots + mi/42 \geq 1.$$

4. A composite substrate for the production of circuit boards manufactured from an amorphous dipolymer of 58–99 mole % of perfluoro-2,2-dimethyl-1,3-dioxole with a complementary amount of a comonomer selected from the class consisting of the following compounds:
   (a) chlorotrifluoroethylene,
   (b) vinylidene fluoride,
   (c) trifluoroethylene,
   (d) perfluoro(alkyl vinyl ethers) of the formula $CF_2\!=\!CFORF$, where Rf is a normal perfluoroalkyl radical having 1–3 carbon atoms,
   (e) fluorovinyl ethers of the formula $CF_2\!=\!CFOQZ$, where Q is a perfluorinated alkylene radical containing 0–4 ether oxygen atoms, wherein the sum of the C and O atoms in Q is 2 to 10; and Z is a group selected from the class consisting of —COOR, —SO2F, —CN, —COF, and —OCH3, where R is a C1–C4 alkyl,
   (f) vinyl fluoride, and (g) (perfluoroalkyl)ethylene, RfCH=CH2, where Rf is a C1-Cnormal perfluoroalkyl radical;

the glass transition temperature of the copolymer being at least 140° C.;

the maximum mole percentage, Mb . . . Mi, of the comonomer in the dipolymers being as follows:
(a) for chlorotrifluoroethylene, Mb=42,
(b) for vinylidene fluoride, Mc=20,
(c) for trifluoroethylene, Me=30,
(d) for CF2=CFORF, Mf=30,
(e) for CF2=CFOQZ, Mg=20,
(f) for vinyl fluoride, Mh=25, and
(g) for RfCH=CH2, Mi=10.

5. An electric current carrying component or device being a circuit board or a component thereof comprising at least one electronic circuit element and containing at least one dielectric element, said dielectric element being made of an amorphous dipolymer of 58-99 mole % of perfluoro-2,2-dimethyl-1,3-dioxole with a complementary amount of a comonomer selected from the class consisting of the following compounds:
(a) chlorotrifluoroethylene
(b) vinylidene fluoride,
(c) trifluoroethylene,
(d) perfluoro(alkyl vinyl ethers) of the formula CF2=CFORF, where RF is a normal perfluoroalkyl radical having 1-3 carbon atoms,
(e) fluorovinyl ethers of the formula CF2=CFOQZ, where Q is a perfluorinated alkylene radical containing 0-4 ether oxygen atoms, wherein the sum of the C and O atoms in Q is 2 to 10; and Z is a group selected from the class consisting of —COOR, —SO2F, —CN, —COF, and —OCH3, where R is a C1-C4 alkyl,
(f) vinyl fluoride, and
(g) (perfluoroalkyl)ethylene, RfCH=CH2, where Rf is a C1=C8 normal perfluoroalkyl radical;

the glass transition temperature of the copolymer being at least 140° C.;

the maximum mole percentage, Mb . . . Mi, of the comonomer in the dipolymers being as follows:
(a) for chlorotrifluoroethylene, Mb=42,
(b) for vinylidene fluoride, Mc=20,
(c) for trifluoroethylene, Me=30
(d) for CF2=CFORF, Mf=30,
(e) for CF2=CFOQZ, Mg=20,
(f) for vinyl fluoride, Mh=25, and
(g) for RfCH=CH2, Mi=10.

6. An article of electronic circuitry having on at least one of its exposed surfaces a protective coating of an amorphous dipolymer of 58-99 mole % of perfluoro-2,2-dimethyl-1,3- dioxole with a complementary amount of a comonomer selected from the class consisting of the following compounds:
(a) chlorotrifluoroethylene,
(b) vinylidene fluoride,
(c) trifluoroethylene,
(d) perfluoro(alkyl vinyl ethers) of the formula CF2=CFORF, where Rf is a normal perfluoroalkyl radical having 1-3 carbon atoms,
(e) fluorovinyl ethers of the formula CF2=CFOQZ, where Q is a perfluorinated alkylene radical containing 0-4 ether oxygen atoms, wherein the sum of the C and O atoms in Q is 2 to 10; and Z is a group selected from the class consisting of —COOR, —SO2F, —CN, —COF, and —OCH3, where R is a C1-C4 alkyl,
(f) vinyl fluoride, and
(g) (perfluoroalkyl)ethylene, RfCH=CH2, where Rf is a C1=C8 normal perfluoroalkyl radical;

the glass transition temperature of the copolymer being at least 140° C.;

the maximum mole percentage, Mb . . . Mi, of the comonomer in the dipolymers being as follows:
(a) for chlorotrifluoroethylene, Mb=42,
(b) for vinylidene fluoride, Mc=20,
(c) for trifluoroethylene, Me=30
(d) for CF2=CFORF, Mf=30,
(e) for CF2=CFOQZ, Mg=20,
(f) for vinyl fluoride, Mh=25, and
(g) for RfCH=CH2, Mi=10.

* * * * *

UNITED STATES PATENT AND TRADEMARK OFFICE
CERTIFICATE OF CORRECTION

PATENT NO. : 4,982,056
DATED : January 1, 1991
INVENTOR(S) : Edward N. Squire

It is certified that error appears in the above—identified patent and that said Letters Patent is hereby corrected as shown below:

Claim 1, Column 11, line 19, after "maximum" add the following --percentage of all such comonomers taken together, 42 mole %,--.

Claim 2, Column 11, line 68, delete "longer" and substitute therefor -- larger --.

Claim 3, Column 12, lines 14 and 15, delete "CF2-CFORF" and substitute therefor -- CF2=CFORF --.

Claim 4, Column 13, line 2, delete "C1-Cnormal" and substitute therefor -- "C1-C8 normal --.

Claim 4, Column 13, line 13, delete "RfCH-CH2" and substitute therfor -- RfCH=CH2 --.

Claim 6, Column 14, line 29, delete "C1=C8" and substitute therefor -- C1-C8 --.

Signed and Sealed this

Twenty-third Day of June, 1992

Attest:

DOUGLAS B. COMER

*Attesting Officer*  *Acting Commissioner of Patents and Trademarks*